United States Patent
Wimpenny (10) Patent No.: US 8,884,695 B2
(45) Date of Patent: Nov. 11, 2014

(54) EFFICIENT SUPPLY VOLTAGE

(75) Inventor: Gerard Wimpenny, Cambourne (GB)

(73) Assignee: Nujira Limited (GB)

(*) Notice: Subject to any disclaimer, the term of this patent is extended or adjusted under 35 U.S.C. 154(b) by 183 days.

(21) Appl. No.: 13/638,815

(22) PCT Filed: Mar. 29, 2011

(86) PCT No.: PCT/EP2011/054868
§ 371 (c)(1),
(2), (4) Date: Jan. 9, 2013

(87) PCT Pub. No.: WO2011/120996
PCT Pub. Date: Oct. 6, 2011

(65) Prior Publication Data
US 2013/0127547 A1   May 23, 2013

(30) Foreign Application Priority Data

Mar. 30, 2010   (GB) .................................. 1005400.5

(51) Int. Cl.
*H03G 3/20*   (2006.01)
*H03F 1/02*   (2006.01)
*H03F 3/68*   (2006.01)

(52) U.S. Cl.
CPC .............. *H03F 1/02* (2013.01); *H03F 1/0255* (2013.01); *H03F 1/0227* (2013.01); *H03F 3/68* (2013.01)
USPC .......................................... 330/127; 330/136

(58) Field of Classification Search
CPC ...... H03F 1/0211; H03F 1/0244; H03F 1/025
USPC .................... 330/127, 136, 199, 297
See application file for complete search history.

(56) References Cited

U.S. PATENT DOCUMENTS

| 3,319,175 | A | 5/1967 | Kramer |
| 4,131,860 | A | 12/1978 | Fyot |
| 4,651,112 | A * | 3/1987 | Keysor .......................... 330/297 |
| 6,323,733 | B1 | 11/2001 | Gorcea et al. |

FOREIGN PATENT DOCUMENTS

| GB | 2457764 A | 9/2009 |
| GB | 2459894 A | 11/2009 |
| WO | 03013095 A1 | 2/2003 |

OTHER PUBLICATIONS

Robert Barrell, "GB Application No. GB1005400.5 Sear Report", Jul. 13, 2012, Publisher: UK Intellectual Property Office, Published in: GB.

(Continued)

*Primary Examiner* — Steven J Mottola
(74) *Attorney, Agent, or Firm* — Kaplan Breyer Schwarz & Ottesen, LLP (57) ABSTRACT

There is disclosed an arrangement comprising: a driver stage connected to receive an input signal and generate a drive signal; a transformer comprising: a first winding of a first side of the transformer, across which winding a voltage signal is developed in dependence on the drive signal; and a second winding of the first side of the transformer, coupled to the first winding, which exhibits across it a voltage signal related to the voltage across the first winding, by swingback; and a first controller for comparing the voltage exhibited in the second winding to a first threshold voltage, and for selecting a first or a second supply voltage for the arrangement in dependence on the comparison.

20 Claims, 6 Drawing Sheets

(56) References Cited

OTHER PUBLICATIONS

Chow, A.C., et al, "Design and Evaluation of an Active Ripple Filter Using Voltage Injection", "Laboratory for Electromagnetic and Electronic Systems", 2001, pp. 390-397, vol. 1, No. 17, Publisher: Massachusetts Institute of Technology, Published in: Cambridge, MA USA.

H. Ertl, et al., "Basic Considerations and Topologies of Switched-Mode Assisted Linear Power Amplifiers", "ISBN: 978-0-7803-3044-3", Mar. 3, 1996, pp. 207-213, vol. 1, No. 3, Publisher: Technical University Vienna, Power Electronics Secion, Published in: Austria.

F.A. Himmelstoss, et al., "Compensated Class-D Amplifier as High Quality AC-Voltage Source", "IEEE 1999 International Converence on Power Electronics and Drive Systems, PEDS'99, Jul. 1999, Hong Kong", Jul. 1999, pp. 116-120, vol. 1, No. 27, Publisher: Technical University Vienna-Power Electronics Secion, Published in: Austria.

Agerbaek, Thomas, "International Search Report", Jul. 1, 2011, Publisher: PCT, Published in: EP.

* cited by examiner

FIG. 6

EFFICIENT SUPPLY VOLTAGE

BACKGROUND OF THE INVENTION

1. Field of the Invention

The present invention relates to the provision of a supply voltage to a drive amplifier, the drive amplifier providing a drive signal to a winding of a transformer. The invention is concerned particularly, but not exclusively, to an arrangement in which the drive amplifier is a correction amplifier forming a correction path of a control loop, a transformer being used to combine the output of the correction path with an output of a main path. The invention is further particularly, but not exclusively, concerned with such an arrangement providing a modulated supply voltage to an RF (radio frequency) amplifier, the modulated supply voltage being provided by the combined output of the transformer.

2. Background to the Invention

Key amplifier characteristics such as load impedance, supply voltage and peak efficiency are determined by an amplifier's maximum output power requirements. If a power amplifier, such as an RF amplifier, is operated at less than maximum output power its efficiency is reduced. When amplifying a high dynamic range signal, the power amplifier typically achieves maximum output power only rarely and frequently operates at significantly lower power. Hence, the power amplifier may exhibit low overall efficiency.

Various techniques are known in the art for enhancing power amplifier efficiency based on the supply voltage. One broad classification of solution is envelope tracking.

In a known envelope tracking technique an efficient switched mode supply stage, comprising a variable pulse width modulator, may be combined with a linear correction amplifier. The efficient switched mode supply provides a coarse approximation of the output signal, containing a majority of the required power, and the linear correction amplifier provides a high bandwidth correction signal which is combined with the coarse approximation signal. A modulated power supply with high bandwidth and generally good efficiency is thereby provided.

An example of an RF amplification stage incorporating a particularly advantageous technique in accordance with these principles is disclosed in British Patent No. 2398648.

In general, in such a control system, a coarse or low frequency path is fed by a control signal which is low-pass filtered and then used to control a switched mode power supply that provides the coarse output. In a correction path, a feedback signal is received from the output. The feedback signal is compared with an ideal reference to produce an error signal. A linear correction amplifier in the correction path provides a high frequency correction output from the error signal. The correction output is combined with the coarse output to provide an error-corrected output. The error-corrected output provides the modulated supply voltage.

Overall such an arrangement, particularly when used for providing a modulated power supply, provides high efficiency and high bandwidth amplification simultaneously.

However inefficiencies arise in respect of certain components within the linear correction amplifier. The linear correction amplifier must operate over a wide range of potential voltages, up to a possible peak voltage. The linear correction amplifier has to provide a large negative correction voltage during periods of high voltage from the coarse output. Conversely a large positive correction voltage is required during periods of low voltage from the coarse output. If the supply voltage in the linear correction amplifier is fixed, it has to be set to a sufficient value for the amplifier to provide any peak output levels without clipping. This requires the amplifier to have a higher supply voltage than necessary most of the time, and consequently its efficiency is degraded.

It is an aim of the invention to address the above-stated problem.

In particular it is an aim of the invention to provide a technique in which the voltage drop across the output device of the correction amplifier is reduced. It is an aim of the invention particularly to provide such an improvement in an arrangement in which a transformer is used to combine the outputs of a coarse path and a correction path.

SUMMARY OF THE INVENTION

In one aspect the invention provides an arrangement comprising: a driver stage connected to receive an input signal and generate a drive signal; a transformer comprising: a first winding of a first side of the transformer, across which winding a voltage signal is developed in dependence on the drive signal; and a second winding of the first side of the transformer, coupled to the first winding, which exhibits across it a voltage signal related to the voltage across the first winding; and a first controller for comparing the voltage exhibited in the second winding to a first threshold voltage, and for selecting a first or a second supply voltage for the arrangement in dependence on the comparison.

The voltage exhibited across the second winding related to the voltage across the first winding can be referred to as a swingback voltage.

The second supply voltage may be greater than the first supply voltage, and the controller may be adapted to select the first supply voltage if the drive signal voltage is less than the maximum voltage which can be linearly amplified using the first supply voltage, and select the second supply voltage if the drive signal voltage is greater than said maximum voltage.

The first winding of the first side of the transformer may be arranged to be connected to the amplified signal at a first end thereof, and to be connected to the selected one of the first or second supply voltage at a second end thereof.

The first controller may include a voltage translator for translating the voltage exhibited across the second winding into a modified voltage.

The voltage translator may apply a predetermined offset to the voltage exhibited across the second winding to generate the modified voltage. The voltage translator may be a Zener diode.

The controller may include a switch for selecting the second supply voltage. The switch may selectively connect the second supply voltage to the second end of the first winding of the first side of the transformer. The switch may be a transistor.

The controller may include an isolation circuit for selectively isolating the first winding of the transformer from the first supply voltage. The isolation circuit may isolate the first supply voltage from the other end of the first winding of the transformer when the second supply voltage is selected. The isolation circuit may be a Schottky diode.

There may further be provided a winding of a second side of the transformer, wherein one end of the winding of the second side of the transformer is connected to a voltage signal, and the other end provides a sum of said voltage signal and a voltage induced across the second side of the transformer as a result of voltages across the windings of the first side of the transformer.

The first controller may comprise: a first Zener diode; and a first transistor, wherein: the cathode of the first Zener diode is connected to receive the voltage signal across the second winding, the anode of the first Zener diode is connected to the gate of the first transistor, and the channel of the first transistor is connected between the second supply voltage and the other end of the first winding.

The arrangement may further comprise a first Schottky diode having an anode connected to the first voltage supply and a cathode connected to the first winding.

The first threshold voltage may be determined by the breakdown voltage of the Zener diode and the threshold voltage of the transistor.

If the swingback voltage is less than the threshold voltage the transistor may be off, and power may be drawn from the first supply voltage.

If the voltage exhibited in the second winding is greater than the threshold voltage the transistor may be on, and power may be drawn from the second supply voltage.

The second supply voltage may be greater than the first supply voltage.

The amplifier may include a transistor arranged to receive the signal to be amplified at a gate thereof, and having its channel connected to one side of the first winding to deliver the amplified signal thereto.

The stage may be double-sided, the first winding of the side of the transformer being arranged to receive one side of the amplified signal, and the second winding of the second side of the transformer being arranged to receive the other side of the amplified signal.

A third and a fourth supply voltage may be provided for the other side of the amplifier. The third and the fourth supply voltage may be provided by the first and second supply voltages respectively.

The first winding of the first side of the transformer may exhibit the voltage signal in the second winding. This is achieved by swingback.

The arrangement may further comprise a second controller for comparing the voltage exhibited in the first winding to a second threshold voltage, and for selecting the third or fourth supply voltage in dependence on the comparison.

The second threshold voltage may be derived from the first threshold voltage.

The second controller may comprise a voltage translator for translating the voltage exhibited across the first winding into a modified voltage.

The second controller may include a switch for selecting the fourth supply voltage.

The second controller may include an isolation circuit for selectively isolating the second winding of the transformer from the third supply voltage when the fourth supply voltage is connected.

The magnitude of the fourth supply voltage may be greater than the magnitude of the third supply voltage.

The arrangement may further comprise: a third supply voltage for the amplification stage; and a second controller for comparing the voltage exhibited in the second winding to a second threshold voltage, and for selecting the third supply voltage in dependence on the comparison.

The second controller may include a voltage translator for translating the voltage exhibited across the second winding into a second modified voltage.

The second controller may include a switch for selecting the third supply voltage.

The second, controller may further include an isolation circuit for selectively isolating the first winding of the transformer from the second supply voltage.

The second controller may isolate the first winding from the second supply voltage on selection of the third supply voltage.

If the voltage exhibited is greater than the second threshold voltage, the third supply voltage is delivered to the amplifier.

The third supply voltage may be greater than the second supply voltage.

The arrangement may be arranged to combine two inputs signals using the transformer, wherein the drive signal comprises the first input signal, and a second input signal is connected to a side of a winding of a second side of the transformer, the other side of the winding of the second side of the transformer providing a combined output signal.

The driver stage may be an amplifier, the driver signal being an amplified version of the input signal.

In another aspect the invention provides a method comprising: generating a drive signal; developing a voltage signal across a first winding of a first side of a transformer in dependence on the drive signal; and exhibiting a voltage signal, corresponding to the voltage signal developed across the first winding, across a second winding of the first side of the transformer; comparing the swingback voltage developed in the second winding to a first threshold voltage; and selecting a first or a second supply voltage in dependence on the comparison.

The exhibited voltage may be developed by swingback.

The second supply voltage may be greater than the first supply voltage, and the selecting step comprises selecting the first supply voltage if the drive signal voltage is less than the maximum voltage which can be linearly amplified using the first supply voltage, and selecting the second supply voltage if the drive signal voltage is greater than said maximum voltage.

The method may further comprise connecting one end of the first winding to the amplified voltage signal, and connecting the selected one of the first or second supply voltage at the other end thereof.

The method may further comprise translating the swingback voltage generated across the second winding into a modified voltage.

The method may further comprise applying a predetermined offset to the exhibited voltage to generate the modified voltage.

The method may further comprise selecting the second supply voltage by controlling a switch. The switch may selectively connects the second supply voltage to the other end of the first winding of the first side of the transformer.

The method may further comprise selectively isolating the first winding of the transformer from the first supply voltage.

The step of isolating may comprise isolating the first supply voltage from the other end of the first winding of the transformer when the second supply voltage is selected.

The method may further comprise connecting one end of a second winding of the transformer to a voltage signal, the other end providing a sum of the voltage signal with the drive signal voltage.

The method may further comprise providing one side of a double-sided drive signal at one side of the first winding of the first side, and providing the other side of the double-sided drive signal at the second winding of the first side of the transformer.

The method may further comprise providing a third and a fourth supply voltage for the other side of the transformer.

The method may, further comprise providing a third supply voltage and comparing the exhibited voltage in the second winding to a second threshold voltage, and selecting the third supply voltage in dependence on the comparison.

BRIEF DESCRIPTION OF THE FIGURES

The present invention is now described by way of example with reference to the accompanying Figures, in which.

DESCRIPTION OF THE PREFERRED EMBODIMENTS

The present invention is described herein by way of particular examples and specifically with reference to preferred embodiments. It will be understood by one skilled in the art that the invention is not limited to the details of the specific embodiments given herein. In particular the invention is described herein by way of reference to the provision of a power supply for an RF amplification stage. Whilst this represents a particularly advantageous implementation of the principles of the invention, the invention may more generally apply to any arrangement where it is necessary to improve the efficiency of a driver stage providing a drive signal to the winding of a transformer.

In the following description with reference to the Figures, where common reference numerals appear between different Figures they refer to the same elements.

Figure 1:
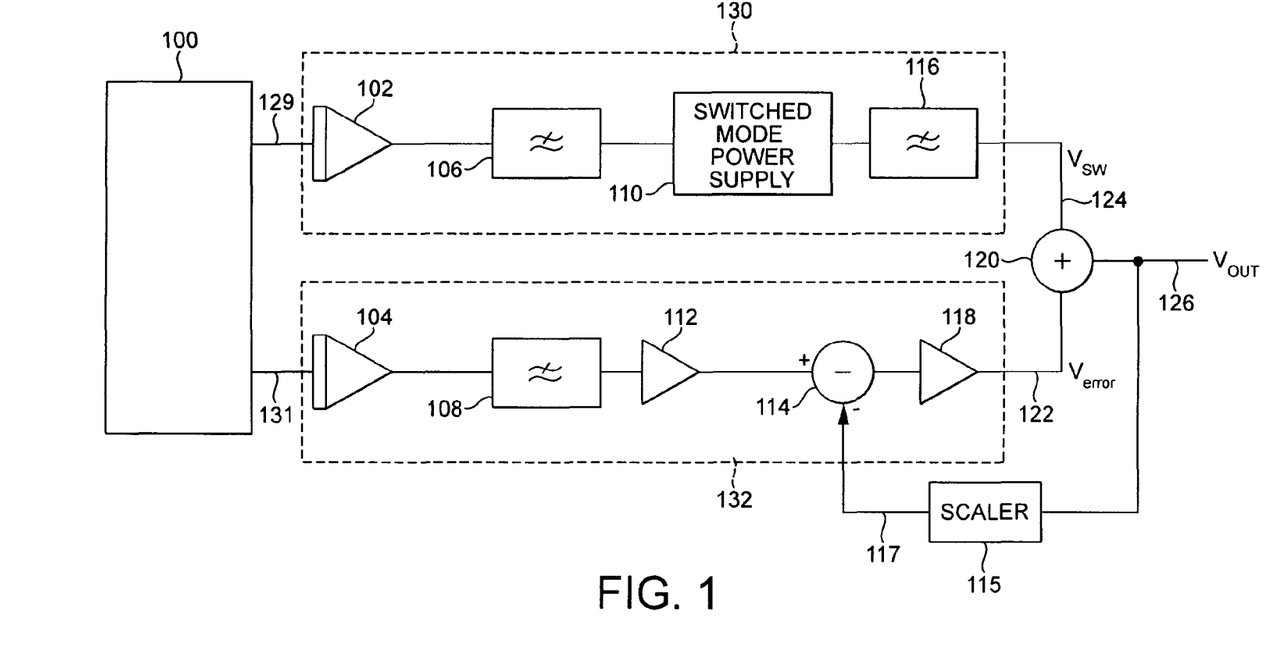
FIG. 1 illustrates a control loop in which embodiments of the invention may be implemented.

With reference to FIG. 1 there is illustrated in schematic form the main elements of a control loop in which preferred embodiments of the invention may be implemented. Such a control loop is suitable for generating a modulated supply voltage, which modulated supply voltage may provide the supply voltage for an RF amplifier. The control system of FIG. 1 is suitable for use as an envelope tracking power supply for an RF power amplifier.

With reference to FIG. 1 block 100 represents a digital control block for providing control signals. A first control signal is provided on output line 129 to a first signal path 130, and a second control signal is provided on output line 131 to a second signal path 132. These control signals on lines 129 and 131 are the appropriate reference signals required by each path. The generation of such reference signals is not described in detail herein. The generation of such signals, by a variety of known techniques, will be within the scope of one skilled in the art. In general, the generated reference signals are representative of a signal to be amplified by the exemplary RF amplifier. The digital control block 100 provides a first control signal on line 129 as an input to a digital-to-analogue converter 102 of the first signal path 130. The digital control block 100 provides a further control signal on line 131 as an input to a digital-to-analogue converter 104 of the second signal path 132.

In general terms, the first signal path 130 can be termed a coarse signal path, as the path generates a signal (as will be described further hereinbelow) which is a coarse representation of the reference signal on line 129. The coarse signal path may also be referred to as a low frequency path. Also in general terms, the second signal path 131 can be termed a correction path, as the path generates a signal (as will be described further hereinbelow) which represents an error in the coarse representation generated by the first path, in dependence on the reference signal on line 131 and a signal fed back from the output. The correction signal path may also be referred to as a high frequency path. In the further description below, the first and second signal paths are therefore generally referred to as a coarse signal path and a correction signal path.

The control loop of FIG. 1 further includes a combiner 120. The combiner receives at a first input the coarse output signal on a line 124 from the coarse signal path. The combiner also receives at a second input the correction output signal on a line 122 from the correction signal path. The combiner 120 combines these two signals to provide an output of the control loop on line 126, which corresponds to the coarse output signal with an error removed therefrom.

The coarse signal path 130 includes the digital-to-analogue converter 102, a low-pass filter 106, a switched-mode power supply 110, and a low-pass filter 116. The low-pass filter 106 filters the control signal from the digital-to-analogue converter 102 to provide a control signal to the switched-mode power supply 110. The appropriate switched voltage is generated at the output of the switched-mode power supply 110, and filtered by the low-pass filter 116. The output of the low-pass filter 116 comprises the output voltage of the coarse signal path 130 on line 124, which output voltage is denoted $V_{SW}$.

The output voltage of the coarse signal path, $V_{SW}$, on line 124 forms a first input to a combiner 120.

The correction signal path 132 includes the digital-to-analogue converter 104, a low-pass filter 108, a reference amplifier 112, a subtractor 114, and a linear correction amplifier 118.

The signal generated by the digital-to-analogue converter 104 is provided as an input to the low-pass filter 108. The low-pass filter 108 has a much higher cut-off frequency than the low-pass filter 106, and operates as a reconstruction filter. The output of the low-pass filter 108 is provided to the reference amplifier 112.

The output of the reference amplifier 112 provides a first input to the subtractor 114. The second input to the subtractor 114 is provided on a line 117. The signal on line 117 represents the output signal generated by the combiner 120 on line 126. The output signal on line 126 is fed back to a scaler 115, which scales the output signal and provides it on line 117 at its output.

The subtractor 114 subtracts the signal representing the output on line 117 from the signal provided by the reference amplifier 112. The subtractor 114 thus provides at its output an error signal representing the error in the output signal compared to an ideal reference signal.

The error signal at the output of the subtractor 114 is amplified by the correction amplifier 118 and delivered to the second input of the combiner 120 on line 122. The signal on line 122 represents the error voltage $V_{ERROR}$ (or correction voltage), between the output signal $V_{OUT}$ and the coarse signal path output voltage V. As mentioned above, the combiner 120 combines the voltage signal $V_{SW}$ at the output of the coarse signal path with the error voltage, $V_{ERROR}$ at the output of the correction signal path to generate the output voltage $V_{OUT}$ on line 126.

As discussed in the background section hereinabove, inefficiencies arise in respect of the correction amplifier 118. In prior art arrangements the correction amplifier 118, which is an AC amplifier, is provided with a fixed voltage supply, which fixed voltage supply must be set at a level sufficient to handle all possible peaks. This results in inefficiencies when the voltage being amplified is below such peak.

Figure 2:
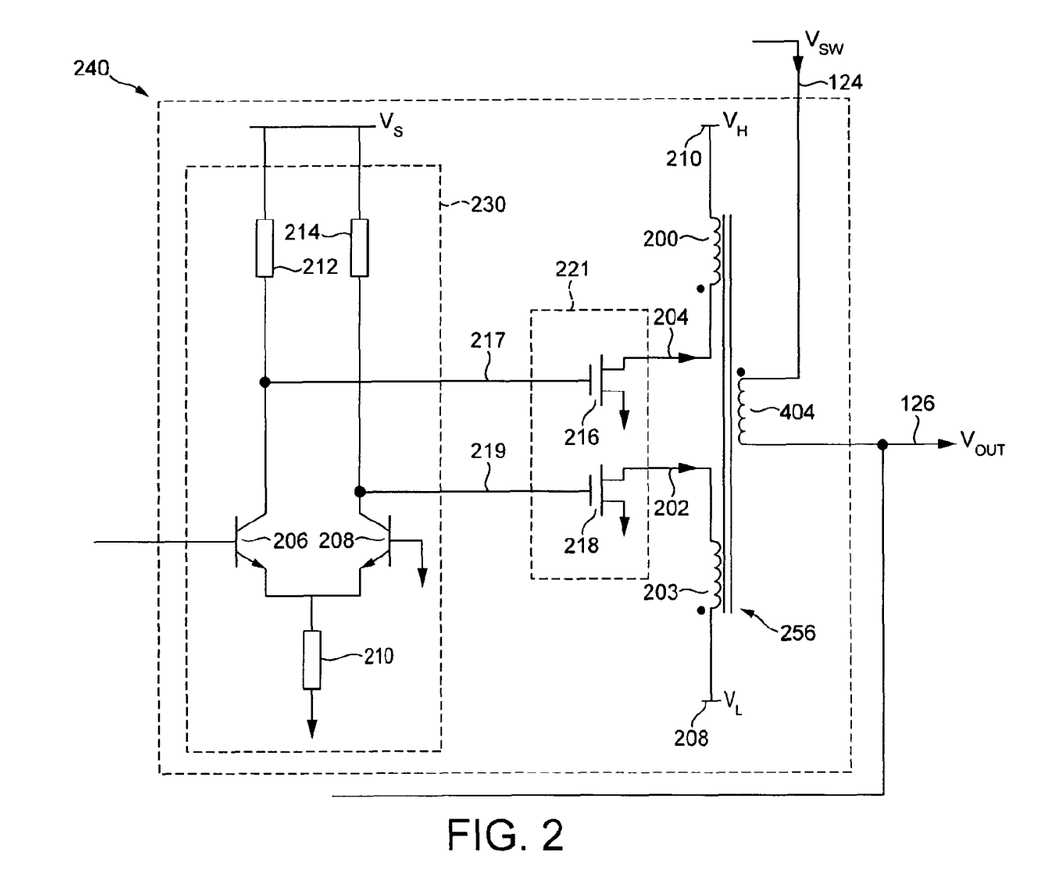
FIG. 2 illustrates an exemplary implementation of an AC amplifier and transformer-combiner with which embodiments of the invention may be implemented.

To further understand the invention and how it addresses the above-stated problem, reference is made to FIG. 2 where there is shown an example implementation of the correction amplifier 118 and combiner 120 of FIG. 1 in simplified schematic form, where the implementation of the combiner 120 is by way of a transformer. A transformer is an advantageous way to implement the combiner 120.

The example implementation of the correction amplifier and combiner in FIG. 2 is generally denoted by reference numeral 240. The correction amplifier 118 is formed of a differential amplifier 230 and an output or driver stage 221. The combiner 120 is formed of a transformer 256.

The error signal at the output of the subtractor 114 is provided as an input to the differential amplifier 230.

The exemplary differential amplifier stage 230 includes a pair of bipolar transistors 206 and 208 (which could also be implemented as field effect transistors), and resistors 212, 214 and 210. The emitters of the transistors 206 and 208 are connected together and connected to one terminal of a resistor 210, the other terminal of the resistor 210 being connected to a negative supply voltage. The base of the transistor 206 is connected to the output of the subtractor 114, and the base of the transistor 208 is connected to a voltage reference selected to suit the bias requirements of transistors 216 and 218. The collector of the transistor 206 is connected to a supply voltage $V_S$ via the resistor 212. The collector of the transistor 208 is connected to the supply voltage $V_S$ via the resistor 214.

The differential amplifier 230 provides complementary output signals on lines 217 and 219 to drive the output stage 221 of the correction amplifier 118. The complementary output signals on lines 217 and 219 are taken from the respective collectors of the transistors 206 and 208 (possibly via buffer amplifiers).

The output stage 221 comprises transistors 216 and 218. Referring further to FIG. 2, the output at the collector of the transistor 206 on line 217 is connected to the gate of field effect transistor 216. The output at the collector of the transistor 208 on line 219 is connected to the gate of field effect transistor 218. The transistors 216 and 218 could alternatively be implemented as bipolar transistors. As will be described further hereinbelow, the transistor 216 is used to generate positive correction voltages at the output of the correction amplifier, and the transistor 218 is used to generate negative correction voltages at the output of the correction amplifier.

The source of the transistor 216 is connected to ground and the drain of the transistor 216 is connected to a tap of a first primary winding 200 of the transformer 256 on line 204. The other tap of the first primary winding 200 is connected to a high voltage supply $V_H$ denoted by reference numeral 210. A positive correction to the coarse output voltage signal $V_{SW}$ on line 124 is generated by transistor 216 when $V_{SW}<V_{OUT}$. The voltage on line 204 reduces when a positive correction is made.

The source of the transistor 218 is connected to ground. The line 202 is connected to a tap of a second winding 203 of the primary side of the transformer 256. The other tap of the second winding 203 is connected to a voltage supply $V_L$ denoted by reference numeral 208. A negative correction to the coarse signal $V_{SW}$ is generated by transistor 218 when $V_{OUT}<V_{SW}$. The voltage on line 202 reduces when a negative correction is made.

The transformer 256 includes the two primary windings, denoted by reference numerals 200 and 203 as referenced hereinabove. As set out above, positive corrections for the coarse signal $V_{SW}$ are delivered by the first winding 200, and negative corrections are delivered by the second winding 203.

The secondary side of the transformer 256 includes a single winding 404. A first tap of the secondary winding 404 is connected to receive the coarse voltage $V_{SW}$ on line 124 from the coarse signal path. The output voltage, VOUT, including error correction, is then generated at the second tap of the winding 404 on line 126.

In operation, as known in the art, the voltage $V_{SW}$ is increased or decreased by the voltages generated across the transformer secondary winding 404 from the primary windings 200 and 203 to generate the output voltage $V_{OUT}$ on line 126.

Each of the supply voltages to the transformer combiner 120, $V_H$ and $V_L$, must be sized to accommodate any peak (positive or negative respectively) which the output stage 221 of the correction amplifier 118 must handle. In the prior art these supply voltages are therefore set and fixed at peak levels. As noted above, this results in inefficiencies in the operation of the output stage 221 of the correction amplifier 118, which adversely affects the overall efficiency of the control stage.

In accordance with the invention, the combiner stage 120 is modified such that efficiency improvements are obtained by controlling either one or both of the supply voltages to the transformer combiner such that inefficiencies due to the need to accommodate the peak voltage supply is reduced. The control of one or both of the supply voltages to the transformer combiner reduces the power dissipated in the output device of the output stage 221 of the correction amplifier. The voltage across the transistors 216 and 218 is thus reduced.

Figure 3:
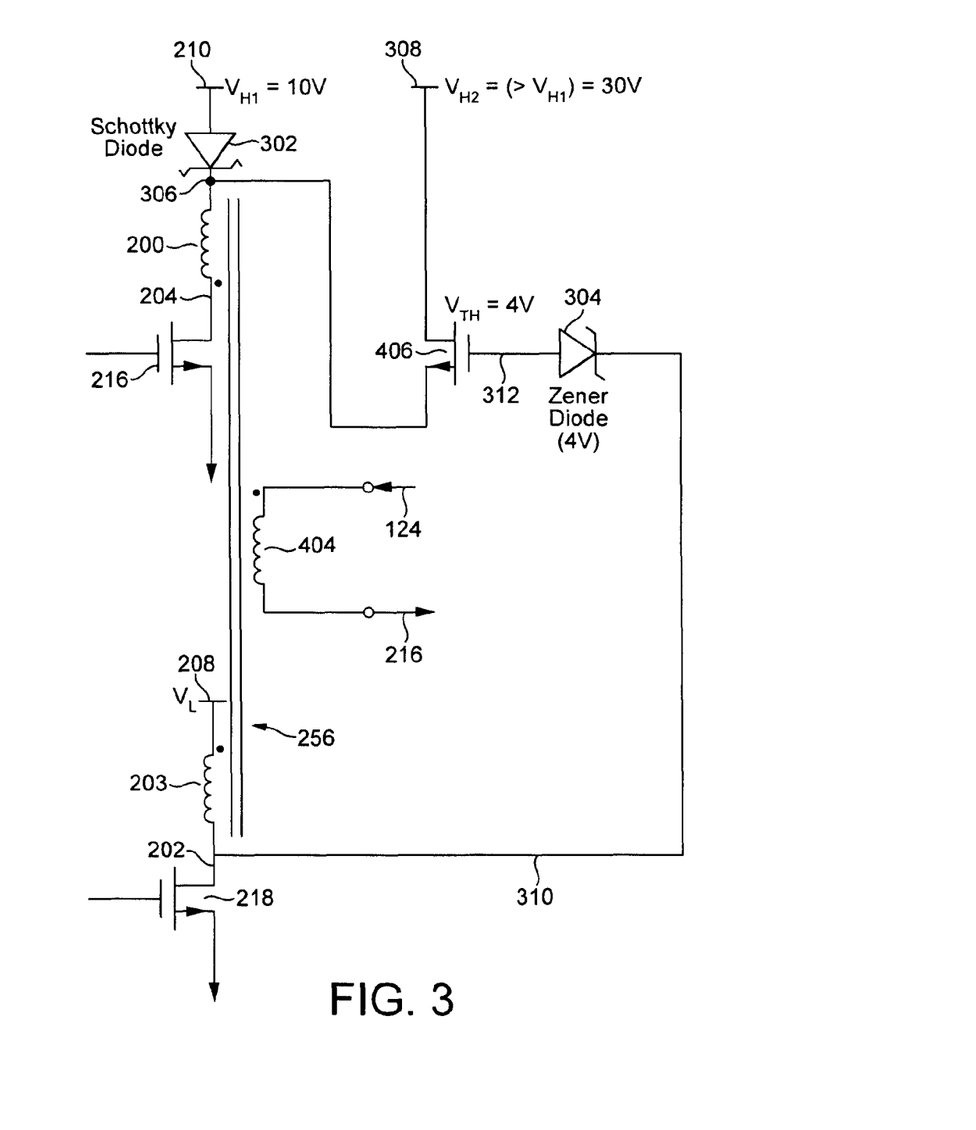
FIG. 3 illustrates a modification to the AC amplifier and transformer in accordance with a first embodiment of the invention.
Figure 5:
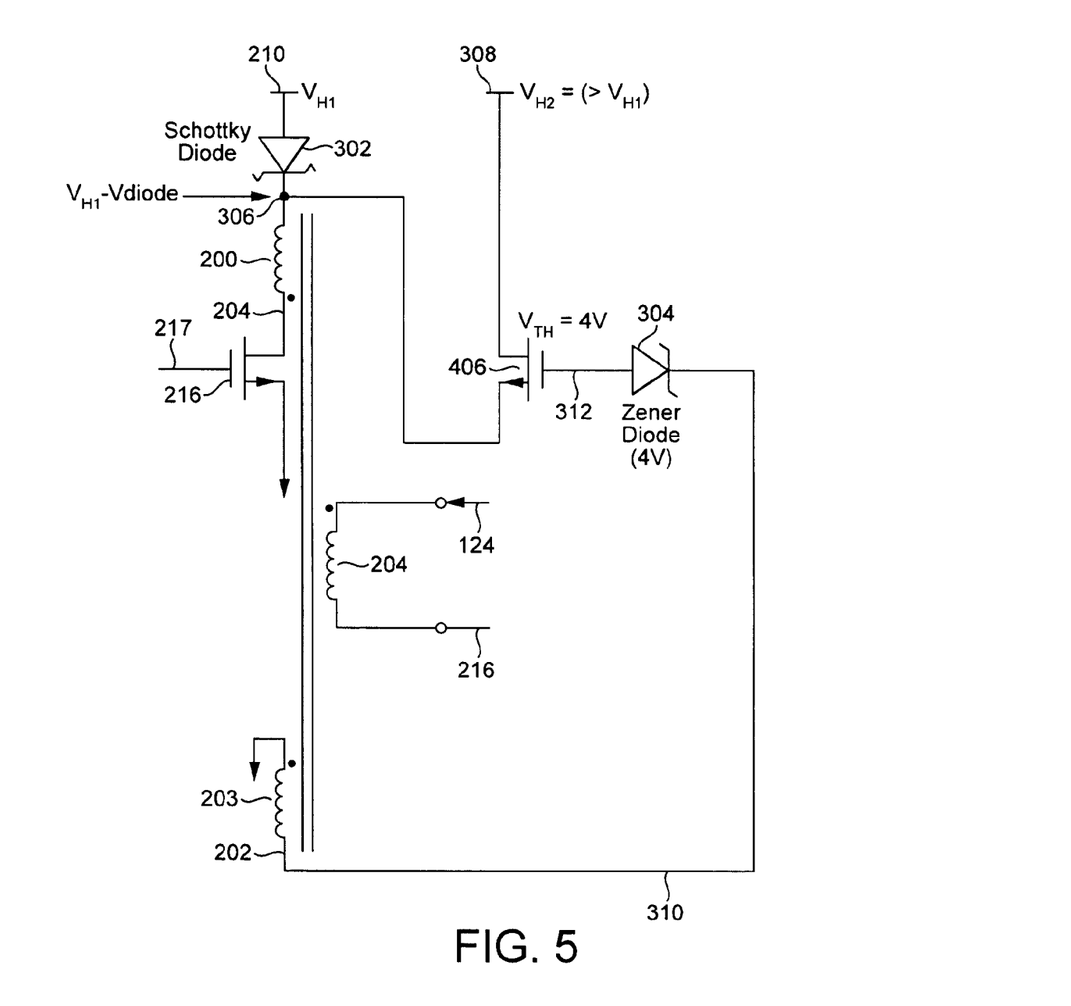
FIG. 5 illustrates a modification to the AC amplifier and transformer in accordance with a second embodiment of the invention.
Figure 6:
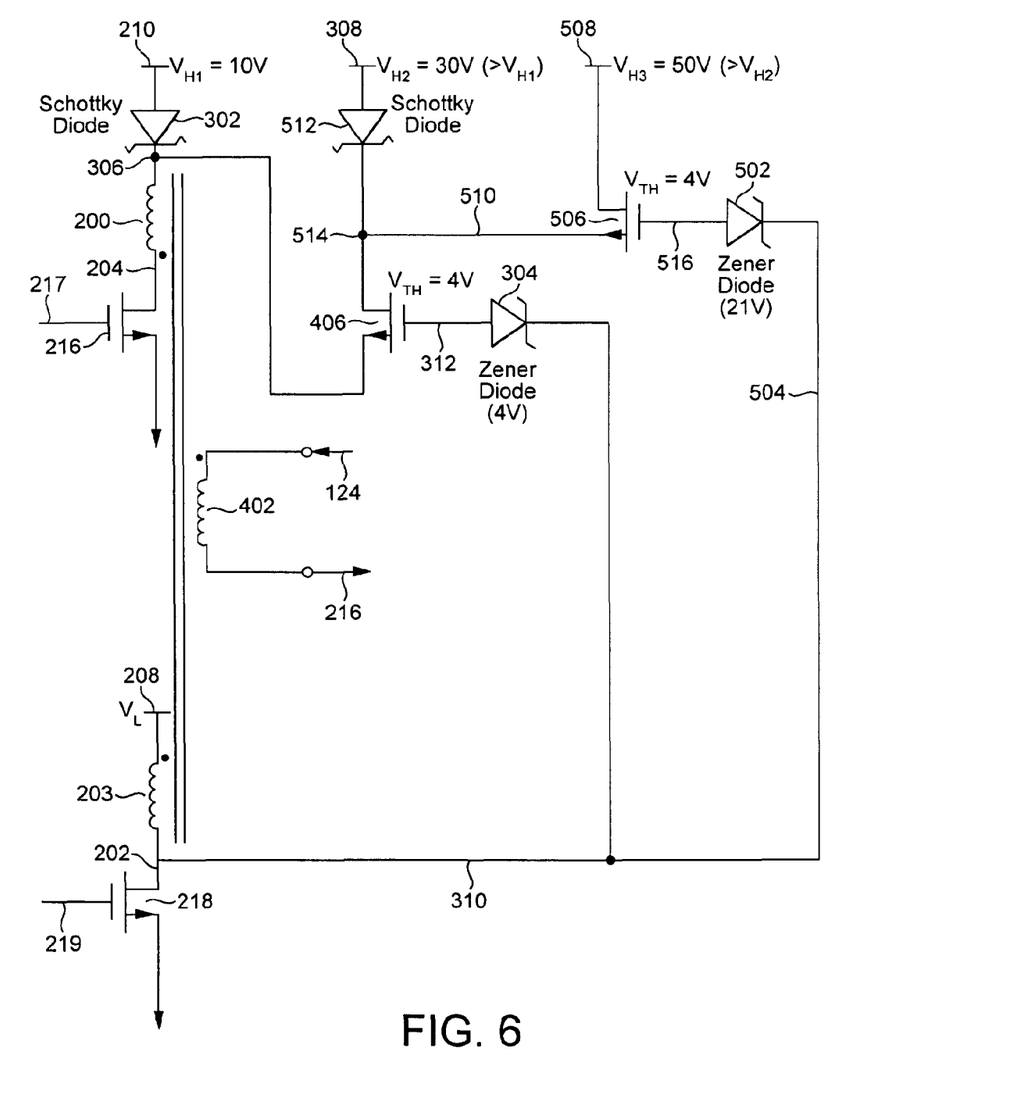
FIG. 6 illustrates a modification to the AC amplifier and transformer in accordance with a third embodiment of the invention.

With reference to FIGS. 3, 5 and 6, first, second and third embodiments of the invention are respectively described. It should be noted that in each of FIGS. 3, 5 and 6 only those elements of previous Figures are shown which are necessary for understanding the principles of the invention. As such the transistors 216 and 218 of the correction amplifier, providing the drive signals to the transformer 256, are illustrated together with the transformer 256. Further modifications associated with embodiments of the invention affect only these portions of the control loop.

In accordance with the first embodiment of the invention, and with reference to FIG. 3, the arrangement of FIG. 2 is modified to provide a voltage translator (in the exemplary arrangement a Zener diode 304), a switch (in the exemplary arrangement a transistor 406), and an isolation circuit (in the exemplary arrangement a Schottky diode 302). In addition a second high voltage supply, $V_{H2}$, is added as denoted by reference numeral 308. The high voltage supply $V_H$ of FIG. 2 is denoted in FIG. 3 as $V_{H1}$, a first high voltage supply.

Although a Zener diode is illustrated as providing the voltage translator in the example, in general any means of providing a voltage offset may be utilised, which may in general be represented by a voltage source.

The cathode of Zener diode 304 is connected to the drain of the transistor 218 at node 202, and the anode is connected to the gate of transistor 406, via connection 312.

Although a transistor is illustrated in the example, in general any means for selectively connecting the supply voltage $V_{H2}$ to the transformer winding 200 may be provided.

The drain of the transistor 406 is connected to the second high voltage supply, $V_{H2}$. The source of the transistor 406 is connected to a node 306, being one side, the second tap, of the primary transformer winding 200. This node 306 is the opposite side of the transformer winding 200 to which the drain of the transistor 216 on line 204 is connected.

Although a Schottky diode is illustrated as providing the isolation circuit in the example, in general any means or circuit for isolating the supply voltage $V_{H1}$ from the transformer winding 200 may be provided.

The Schottky diode 302 is connected between the node 306 and the first high voltage supply $V_{H1}$. The cathode of the Schottky diode 302 is connected to the node 306, and the anode of the Schottky diode 302 is connected to the high voltage supply $V_{H1}$.

In general the voltage translator translates a swingback voltage (explained further hereinbelow) to provide a modified voltage for controlling the switch. In the example, the voltage translator applies a predetermined offset to a swingback voltage to generate the modified voltage. In the specific example, the offset is determined by the characteristics of the Zener diode.

The switch provides for the higher voltage to be connected in to provide the supply voltage when the modified voltage reaches a threshold level. In the specific example, the threshold level is defined by the threshold voltage of the transistor 406 implementing the switch. The voltage translator and the switch in combination operate to ensure that the higher voltage is connected in when the swingback voltage reaches a predetermined level.

The isolation circuit ensures that the lower supply voltage is isolated when the higher supply voltage is connected in. As these two supply voltages are connected to a common node, the lower supply voltage must be isolated when the higher supply voltage is connected. When the lower supply voltage is connected, the higher supply voltage is effectively isolated by the opening of the switch.

For the purposes of describing an example, it is assumed that the values of the first high voltage supply $V_{H1}$ and the low voltage supply VL are 10 volts, and the value of the second high voltage supply $V_{H2}$ is 30 volts. In general the second high voltage supply is greater than the first high voltage supply. It is assumed that the transistor 406 has a threshold voltage of 4 volts. It is further assumed that the Zener diode 304 has a breakdown voltage of 4 volts. In general the breakdown voltage of the Zener diode, and the threshold voltage of the transistor 406, are chosen to suit any given implementation.

In general, the transistor 406 may be an enhancement mode FET, a depletion mode FET, or a bipolar transistor.

It is an inherent characteristic of the transformer 256 that any pulse appearing in one or other of the first or second primary windings 200 or 203 is reflected in the other. Thus a pulse appearing in the primary winding 200 is reflected in the primary winding 203, and conversely a pulse appearing in the primary winding 203 is reflected in the primary winding 200. Thus with the first and second windings of a first side of a transformer being coupled, a voltage signal is exhibited in one of the windings (e.g. the second) which is related to the voltage across the other winding (e.g. the first). This well-known phenomenon is known as "backswing" and in this description is referred to as backswing.

Figure 4:
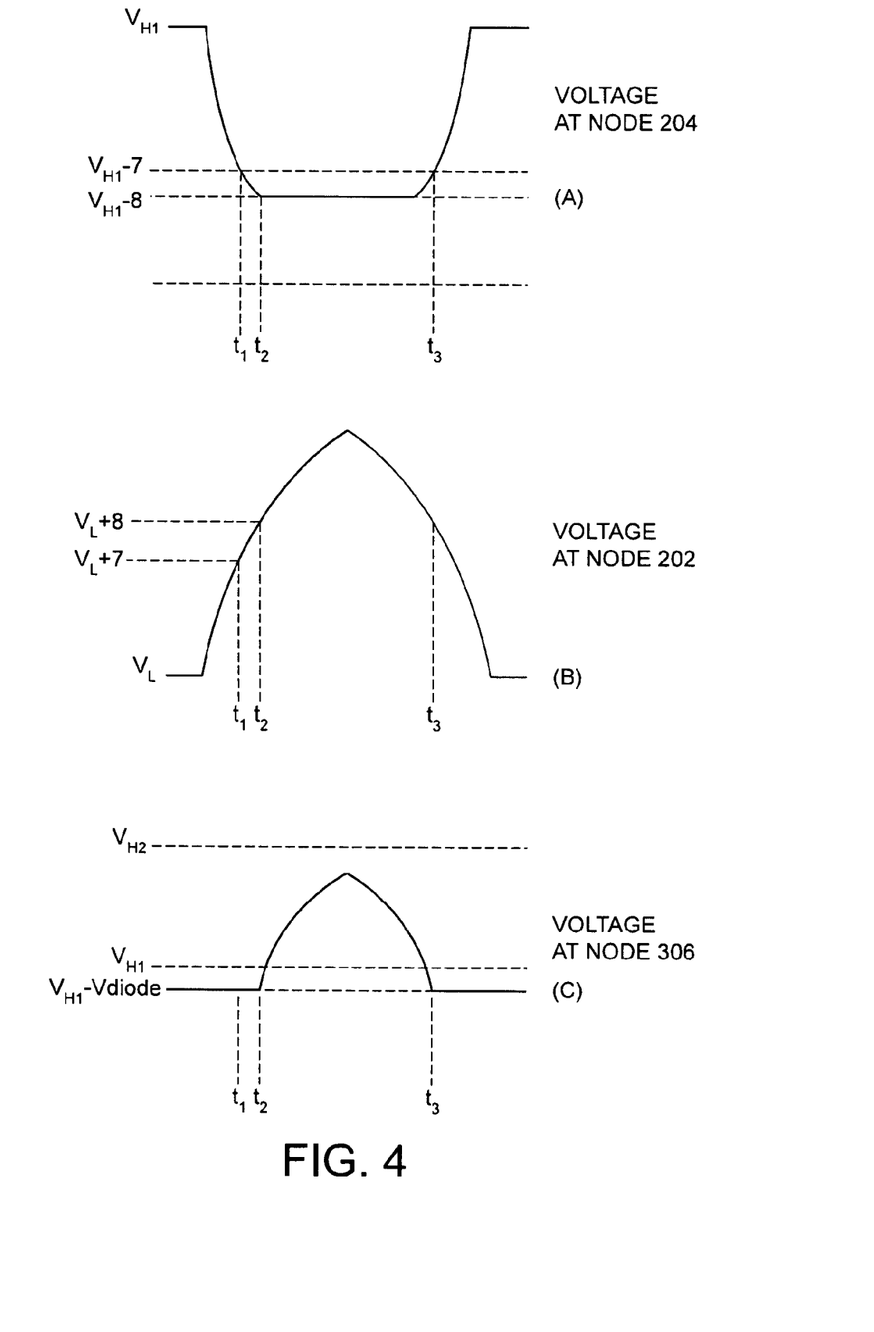
FIG. 4 illustrates the voltages formed in the arrangement of FIG. 3 in an exemplary operation.

By way of example, and with further reference to FIG. 3 and also FIG. 4, an example implementation is described.

It is assumed that at time $t_1$ a voltage of 7 volts is applied across the first winding 200 of the primary side of the transformer such that the voltage at node 204 is 7V less than the voltage at node 210 as illustrated in FIG. 4(a). As a result of backswing, 7 volts is also developed across the second winding 203 of the primary side of the transformer. This results in the voltage at node 202 being 7V greater than the $V_L$ voltage at node 208 as illustrated in FIG. 7(b).

As the voltage across the first winding 200 increases, the voltage across the second winding 203 similarly increases, but with opposite phasing.

At time $t_1$, the voltage at node 306 is $V_{H1}$ (the voltage at node 210) minus one diode voltage drop, being the drop resulting from the presence of Schottky diode 302. This voltage is denoted by $V_{H1}-V_{diode}$ in FIGS. 3 and 4.

When the voltage at node 202 reaches approximately 8 volts greater than the voltage at node 306 at time $t_2$, the transistor 406 having a threshold voltage of 4V begins to turn-on, assuming a Zener diode voltage of 4V. The voltage at node 306 thus begins to rise as illustrated in FIG. 4(c) and starts to track the voltage at node 202 but with a voltage level approximately 8V lower. As shown in FIG. 4(c), the voltage at node 306 rises toward the voltage $V_{H2}$. During this time, the voltage at node 204 does not change, as illustrated in FIG. 4(a). However the voltage across the winding 200 increases by virtue of an increase in the voltage at node 306 whilst the voltage at node 204 is unchanged. As the voltage across the winding 200 increases, the voltage across the winding 203 increases. At the winding 203 this results in a continued increase at node 202 whilst the voltage at node 208 remains unchanged.

The voltage at node 202 is equal to $V_L$ plus the voltage at node 204 subtracted from the voltage at node 306.

Once the transistor 406 is fully turned-on, the supply current for transistor 216 is provided from the second supply $V_{H2}$.

The Schottky diode 302 prevents the current from transistor 406 from flowing into the $V_{H1}$ supply at node 210.

When the voltage across the first winding 200 of the primary side of the transformer drops again below 8V at time $t_3$, the transistor 406 will begin to turn-off, and the supply current for the transistor 216 will be sourced from $V_{H1}$.

As such, and as can be understood from the foregoing example, the backswing effect of the transformer windings can be used to automatically control which of the two supply voltages is used to provide power to the output stage transistor, such that the correction amplifier does not need to be permanently operated from the maximum supply voltage required for distortion free operation. As such for significant portions of time the correction amplifier can operate at a supply voltage which is significantly less than that required to deliver the demanded peak.

The transistor 406 and the Zener diode 304 provide a means for switching the second supply voltage to provide the supply voltage in dependence on a threshold voltage determined by the Zener diode breakdown voltage and the transistor threshold voltage.

The technique in accordance with the invention provides an additional level of power supply only when demanded by the signal and without significant additional circuitry. If the drive signal voltage is less than the maximum voltage which can be linearly amplified by the amplifier 216 using the first supply voltage, the first supply voltage is used. If the drive signal voltage is greater than the maximum voltage which can be linearly amplified by the amplifier 216 using the first supply voltage, the second supply voltage is used.

In FIG. 3 the principle of the present invention is shown in the context of only one half of the power supply. Specifically the principle of the present invention is used to provide an efficiency improvement in respect of the high voltage power supply. The techniques of the present invention may be used, in a mirror-fashion, to provide efficiency improvements in the low voltage power supply, associated with the transistor 218 of the correction amplifier.

The principles of the present invention may be used to provide an improvement in the efficiency on the high voltage side and the low voltage side either alone or in combination.

Where the principle of the invention is used on both the high voltage side and the low voltage side, no extra primary side transformer winding is required. Additional circuitry identical to that illustrated in FIG. 3 may be connected to the transistor 218 in a mirror arrangement.

With reference to FIG. 5, a second embodiment of the invention is described. The second embodiment relates to a single-sided correction amplifier, where only one polarity of the error voltage is provided to the transformer. In known arrangements, where only a single error voltage is provided to the transformer, only a single primary winding is required. In order to utilise the principles of the present invention, in accordance with the second embodiment the second primary winding 202 is retained, to provide a swingback voltage for the Zener diode 304 and transistor 406. As the correction amplifier is single-sided in this embodiment, the transistor 218 of the correction amplifier is not required. The principles of the operation of the embodiment shown in FIG. 5 are identical to those of FIG. 3. A backswing voltage is induced from the first winding 200 to the second winding 203, and when the voltage exceeds a certain level the transistor 406 turns-on to provide an increased supply voltage to the combiner.

With respect to FIG. 6 a third embodiment of the invention is now described. The third embodiment of the invention with respect to FIG. 6 is based on the first embodiment of FIG. 3, and further modified. This embodiment illustrates the cascading of multiple voltage supplies, so that an increased voltage supply may be introduced to the AC amplifier in steps as the voltage required to be amplified increases.

In accordance with the third embodiment of the invention there is additionally provided a Zener diode 502, a transistor 506, and a Schottky diode 512. The cathode of the Zener diode 502 is connected to the drain of the transistor 218 on line 202. The anode of the Zener diode 502 and the gate of the transistor 506 are connected together on a line 516. The drain of the transistor 506 is connected to a third high level supply voltage $V_{H3}$, which has a value greater than the value of $V_{H2}$.

In this example $V_{H3}$ is assumed to be 50 volts, the Zener diode 502 is assumed to have a breakdown voltage of 21 volts, and the threshold voltage of the transistor 506 is assumed to be 4 volts.

The source of the transistor 506 is connected to a point 514 at the drain of the transistor 406. A Schottky diode is connected between the point 514 and the supply voltage $V_{H2}$. The anode of the Schottky diode 512 is connected to the supply source $V_{H2}$, and the cathode of the Schottky diode 512 is connected to the point 514.

The Zener diode 304, the transistor 406, and the Schottky diode 302 operate in exactly the way described with reference to FIG. 3 as the voltage across the transformer winding 200 increases above a level of 8 volts.

When the voltage at the drain of the transistor 218 reaches 25 volts greater than the voltage at node 514, the transistor 506 begins to turn-on and the voltage on line 510 begins to rise and starts to track the voltage at node 202 but with a voltage level approximately 25V less. The Schottky diodes 512 and 302 respectively prevent currents supplied by transistors 406 and 506 from flowing into supplies $V_{H1}$ and $V_{H2}$. The supply current to transistor 216, is provided from additional supply VH3 only when the demand is present.

Each of the embodiments of the invention described with reference to the FIGS. 3, 5 and 6 may be used in combination or alone. The various modifications may be applied to the high voltage or low voltage side, or to both sides.

It is an advantage of the invention in its various embodiments that the voltages applied to the correction amplifier for supply purposes are generally lowered, and current is only drawn from the higher voltage supplies where needed.

The invention may particularly advantageously be applied in a control system for an envelope tracking system, such as an envelope tracking power supply. In particular the invention may advantageously be applied for providing a modulated power supply in an RF amplification system.

The present invention has been described herein by way of reference to particular preferred embodiments. However the invention is not limited to such embodiments. The present invention has particular application in relation to RF amplifiers, but is not limited to such implementation. The invention can be advantageously utilised in any environment in which a transformer winding is driven by an amplifier.

One skilled in the art will appreciate the various modifications and adaptations to the invention and the embodiments described herein are possible within the scope of the invention as defined by the appended claims.

What is claimed is:

1. An arrangement comprising:
   a driver stage connected to receive an input signal and generate a drive signal;
   a transformer comprising:
   a first winding of a first side of the transformer, across which winding a voltage signal is developed in dependence on the drive signal; and
   a second winding of the first side of the transformer, coupled to the first winding, which exhibits across it a voltage signal related to the voltage across the first winding; and
   a first controller for comparing the voltage exhibited in the second winding to a first threshold voltage, and for selecting a first or a second supply voltage for the arrangement in dependence on the comparison.

2. The arrangement of claim 1 wherein the second supply voltage is greater than the first supply voltage, and the controller is adapted to select the first supply voltage if the drive signal voltage is less than the maximum voltage which can be linearly amplified using the first supply voltage, and select the second supply voltage if the drive signal voltage is greater than said maximum voltage.

3. The arrangement of claim 1 wherein the first winding of the first side of the transformer is arranged to be connected to the amplified signal at a first end thereof, and to be connected to the selected one of the first or second supply voltage at a second end thereof.

4. The arrangement of claim 1 wherein the first controller includes a voltage translator for translating the voltage exhibited across the second winding into a modified voltage.

5. The arrangement of claim 4 wherein the voltage translator applies a predetermined offset to the voltage exhibited across the second winding to generate the modified voltage.

6. The arrangement of claim 4 wherein the voltage translator is a Zener diode.

7. The arrangement of claim 1 wherein the controller includes a switch for selecting the second supply voltage, the switch selectively connecting the second supply voltage to the second end of the first winding of the first side of the transformer, the switch being a transistor.

8. The arrangement of claim 1 wherein the controller includes an isolation circuit for selectively isolating the first winding of the transformer from the first supply voltage, the isolation circuit isolating the first supply voltage from the other end of the first winding of the transformer when the second supply voltage is selected, the isolation circuit being a Schottky diode.

9. The arrangement of claim 1 wherein there is further provided a winding of a second side of the transformer, wherein one end of the winding of the second side of the transformer is connected to a voltage signal, and the other end provides a sum of said voltage signal and a voltage induced across the second side of the transformer as a result of voltages across the windings of the first side of the transformer.

10. The arrangement according to claim 1 in which the first controller comprises:
a first Zener diode; and
a first transistor,
wherein:
the cathode of the first Zener diode is connected to receive the voltage signal across the second winding, the anode of the first Zener diode is connected to the gate of the first transistor, and the channel of the first transistor is connected between the second supply voltage and the other end of the first winding.

11. The arrangement according to claim 10 further comprising a first Schottky diode having an anode connected to the first voltage supply and a cathode connected to the first winding, in which the first threshold voltage is determined by the breakdown voltage of the Zener diode and the threshold voltage of the transistor, wherein if the swingback voltage is less than the threshold voltage the transistor is off, and power is drawn from the first supply voltage, wherein if the voltage exhibited in the second winding is greater than the threshold voltage the transistor is on, and power is drawn from the second supply voltage, in which the second supply voltage is greater than the first supply voltage, in which the amplifier includes a transistor arranged to receive the signal to be amplified at a gate thereof, and having its channel connected to one side of the first winding to deliver the amplified signal thereto.

12. The arrangement according to claim 1 in which the stage is double-sided, the first winding of the side of the transformer being arranged to receive one side of the amplified signal, and the second winding of the second side of the transformer being arranged to receive the other side of the amplified signal, and in which a third and a fourth supply voltage are provided for the other side of the amplifier, the third and the fourth supply voltage being provided by the first and second supply voltages respectively.

13. The arrangement according to claim 12 in which the first winding of the first side of the transformer exhibits the voltage signal in the second winding.

14. The arrangement according to claim 7 further comprising a second controller for comparing the voltage exhibited in the first winding to a second threshold voltage, and for selecting the third or fourth supply voltage in dependence on the comparison, the second threshold voltage being derived from the first threshold voltage, the second controller comprises a voltage translator for translating the voltage exhibited across the first winding into a modified voltage, in which the second controller includes a switch for selecting the fourth supply voltage, and in which the second controller includes an isolation circuit for selectively isolating the second winding of the transformer from the third supply voltage when the fourth supply voltage is connected.

15. The arrangement according to claim 12 in which the magnitude of the fourth supply voltage is greater than the magnitude of the third supply voltage.

16. The arrangement according to claim 1 further comprising:
a third supply voltage greater than the second supply voltage for the amplification stage; and
a second controller, including a voltage translator for translating the voltage exhibited across the second winding into a second modified voltage, for comparing the voltage exhibited in the second winding to a second threshold voltage, and for selecting the third supply voltage in dependence on the comparison, in which the second controller includes:
a switch for selecting the third supply voltage,
an isolation circuit for selectively isolating the first winding of the transformer from the second supply voltage, wherein the second controller isolates the first winding from the second supply voltage on selection of the third supply voltage, and if the voltage exhibited is greater than the second threshold voltage, the third supply voltage is delivered to the amplifier.

17. The arrangement of claim 1 arranged to combine two inputs signals using the transformer, wherein the drive signal comprises the first input signal, and a second input signal is connected to a side of a winding of a second side of the transformer, the other side of the winding of the second side of the transformer providing a combined output signal.

18. The arrangement of claim 1 wherein the driver stage is an amplifier, the driver signal being an amplified version of the input signal.

19. An envelope tracking voltage supply comprising:
a driver stage connected to receive an input signal and generate a drive signal;
a transformer comprising:
a first winding of a first side of the transformer, across which winding a voltage signal is developed in dependence on the drive signal; and
a second winding of the first side of the transformer, coupled to the first winding, which exhibits across it a voltage signal related to the voltage across the first winding; and
a first controller for comparing the voltage exhibited in the second winding to a first threshold voltage, and for selecting a first or a second supply voltage for the arrangement in dependence on the comparison.

20. A method comprising:
generating a drive signal;
developing a voltage signal across a first winding of a first side of a transformer in dependence on the drive signal; and
exhibiting a voltage signal, corresponding to the voltage signal developed across the first winding, across a second winding of the first side of the transformer;
comparing the exhibited voltage developed in the second winding to a first threshold voltage; and
selecting a first or a second supply voltage in dependence on the comparison.

* * * * *